(12) United States Patent
Kim

(10) Patent No.: US 7,388,750 B2
(45) Date of Patent: Jun. 17, 2008

(54) PLASMA DISPLAY MODULE

(75) Inventor: Hyuk Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 126 days.

(21) Appl. No.: 11/373,411

(22) Filed: Mar. 10, 2006

(65) Prior Publication Data
US 2006/0214549 A1 Sep. 28, 2006

(30) Foreign Application Priority Data
Mar. 12, 2005 (KR) .................. 10-2005-0020791

(51) Int. Cl.
*H05K 7/20* (2006.01)
*F28F 7/00* (2006.01)
*H01L 23/12* (2006.01)
*H01J 61/52* (2006.01)

(52) U.S. Cl. ............... 361/704; 165/80.2; 165/185; 257/711; 361/707; 361/719; 313/46; 313/48

(58) Field of Classification Search .................. None
See application file for complete search history.

(56) References Cited

U.S. PATENT DOCUMENTS 5,971,566 A * 10/1999 Tani et al. ............... 362/294
6,700,315 B2 * 3/2004 Kim et al. ............... 313/46
6,849,992 B2 * 2/2005 Kim et al. ............... 313/46
2001/0033009 A1 * 10/2001 Inoue et al. ............. 257/668
2001/0048600 A1 * 12/2001 Oishi et al. ............. 362/294
2003/0025427 A1 * 2/2003 Kim et al. ............... 313/46
2003/0102789 A1 * 6/2003 Kim et al. ............... 313/44
2005/0184631 A1 * 8/2005 Kim ........................ 313/45
2006/0158845 A1 * 7/2006 Kim ........................ 361/687

* cited by examiner

*Primary Examiner*—Gregory D Thompson
(74) *Attorney, Agent, or Firm*—Knobbe Martens Olson & Bear LLP

(57) ABSTRACT

A plasma display module, which can effectively dissipate heat, is disclosed. In one embodiment, the plasma display module includes i) a plasma display panel that displays images using gas discharge, ii) a chassis located on one surface of the plasma display panel to support the plasma display panel and iii) a driving circuit unit which is located on a surface of the chassis opposite to the plasma display panel to generate electrical signals for driving the plasma display panel, and includes at least one integrated circuit, wherein the chassis includes at least one convex unit, and the at least one integrated circuit is located on the convex unit of the chassis.

20 Claims, 5 Drawing Sheets

PLASMA DISPLAY MODULE

CROSS-REFERENCE TO RELATED PATENT APPLICATION

This application claims the benefit of Korean Patent Application No. 10-2005-0020791, filed on Mar. 12, 2005, in the Korean Intellectual Property Office, the disclosure of which is incorporated herein in its entirety by reference.

BACKGROUND OF THE INVENTION

1. Field of the Invention

The present invention relates to a plasma display module, and more particularly, to a plasma display module having an increased heat dissipation efficiency.

2. Description of the Related Technology

A plasma display module is a flat display device that displays an image using gas discharge, and has recently drawn attention since it can be used for a large thin screen having a wide viewing angle.

A plasma display module includes a plasma display panel composed of first and second panels, a chassis located on one side of the plasma display panel to support the plasma display panel, a driving circuit unit located on a side opposite to the chassis to generate an electrical signal that drives the plasma display panel, and a circuit mounting element that mounts the driving circuit unit on the chassis.

Electronic parts are located on the driving circuit unit, and generate a great deal of heat, particularly integrated circuits. If the heat is not appropriately dissipated to the environment, the integrated circuits deteriorate, and the performance of the driving circuit unit that includes the integrated circuits is diminished. Therefore, a heat sink for heat dissipation is generally located in close contact with each integrated circuit.

The integrated circuits can be classified into monolithic integrated circuits, in which a semiconductor chip is mounted on a patterned conductive layer, and intelligent power module (IPM) devices in which passive devices, such as individual resistors and capacitors, are mounted together with active devices such as semiconductor chips, on a patterned conductive layer. However, due to structural differences, the IPM device has a larger heat generating area, and accordingly generates more heat than the monolithic integrated circuit. Therefore, a heat sink alone, as in the conventional plasma display module, cannot provide effective heat dissipation from the IPM device.

SUMMARY OF CERTAIN INVENTIVE ASPECTS

One aspect of the present invention provides a plasma display module that can effectively dissipate heat generated by an integrated circuit through a chassis, by improving the heat dissipation structure of the integrated circuit, such as an IPM device, which generates much heat.

Another aspect of the present invention provides a plasma display module that can reduce vibration generated by the integrated circuit and noise resulting from the vibration, by locating a heat radiation sheet having high flexibility and thermal conductivity between the integrated circuit and the chassis.

Another aspect of the present invention provides a plasma display module comprising: i) a plasma display panel that displays images using gas discharge, ii) a chassis located on one surface of the plasma display panel to support the plasma display panel and iii) a driving circuit unit which is located on a surface of the chassis opposite to the plasma display panel to generate electrical signals for driving the plasma display panel, and includes at least one integrated circuit, wherein the chassis includes at least one convex unit, and the at least one integrated circuit is located on the convex unit of the chassis.

In one embodiment, the plasma display module may further comprise a heat radiation sheet interposed between the convex unit of the chassis and the integrated circuit located on the convex unit of the chassis.

In one embodiment, the heat radiation sheet may be formed of a material containing an elastic polymer having high flexibility and thermal conductivity.

In one embodiment, the integrated circuit located on the convex unit of the chassis may be an intelligent power module (IPM) which is formed of a combination of more than two different integrated circuits or comprises one kind of integrated circuit and an independent circuit device.

In one embodiment, the integrated circuit has a heat generation unit located on the surface of the convex unit of the chassis.

In one embodiment, the driving circuit unit may comprise at least one driving circuit substrate.

In one embodiment, the convex unit of the chassis may be located at a higher elevation than the driving circuit substrate.

In one embodiment, the driving circuit substrate may comprise at least one hole through which the convex unit of the chassis can protrude.

In one embodiment, the convex unit of the chassis may be located at a lower elevation than the driving circuit substrate.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Embodiments of the present invention will now be described more fully with reference to the accompanying drawings, in which exemplary embodiments of the invention are shown.

Figure 1:
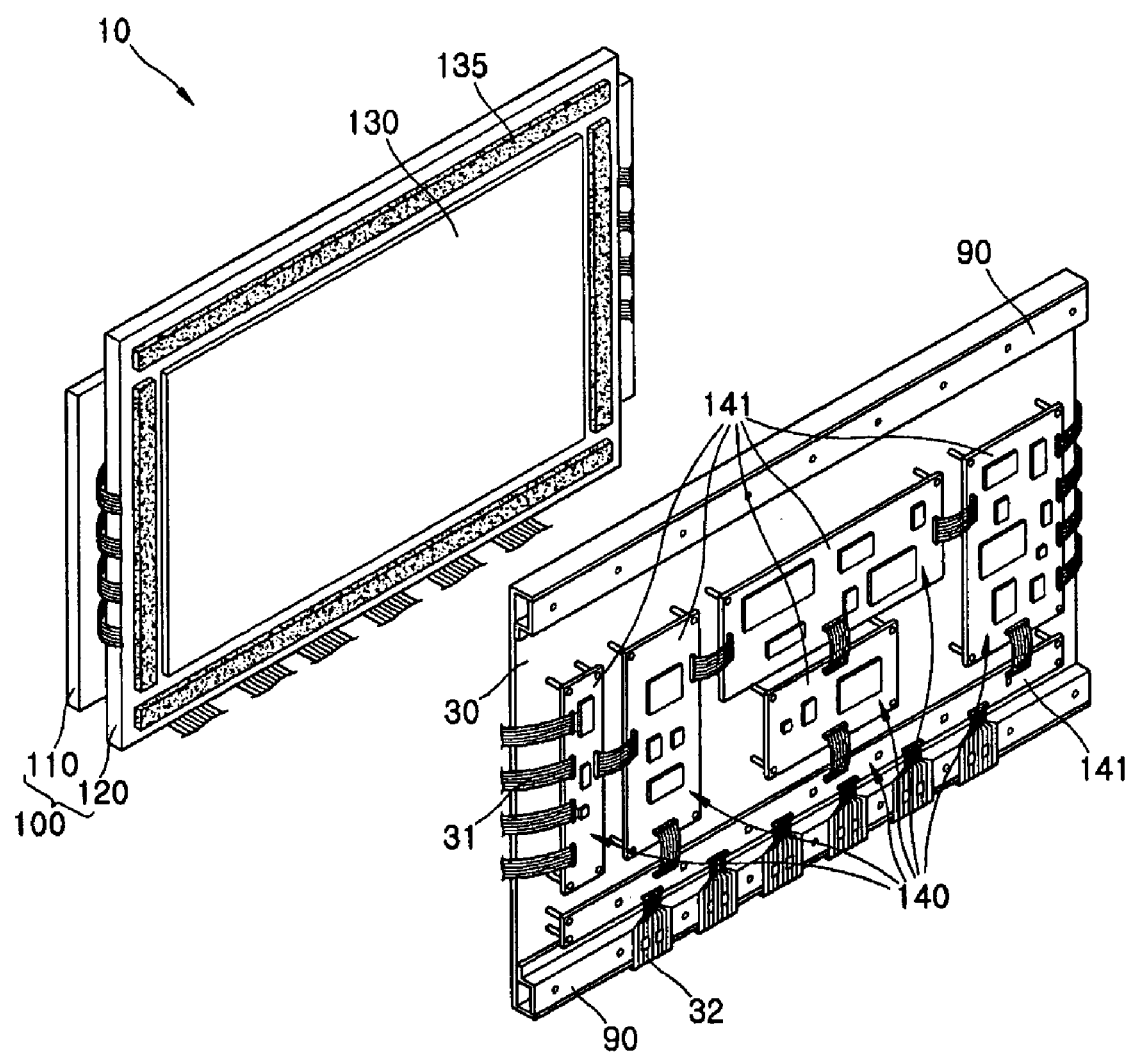
FIG. 1 is an exploded perspective view of a plasma display module according to an embodiment of the present invention.
Figure 2:
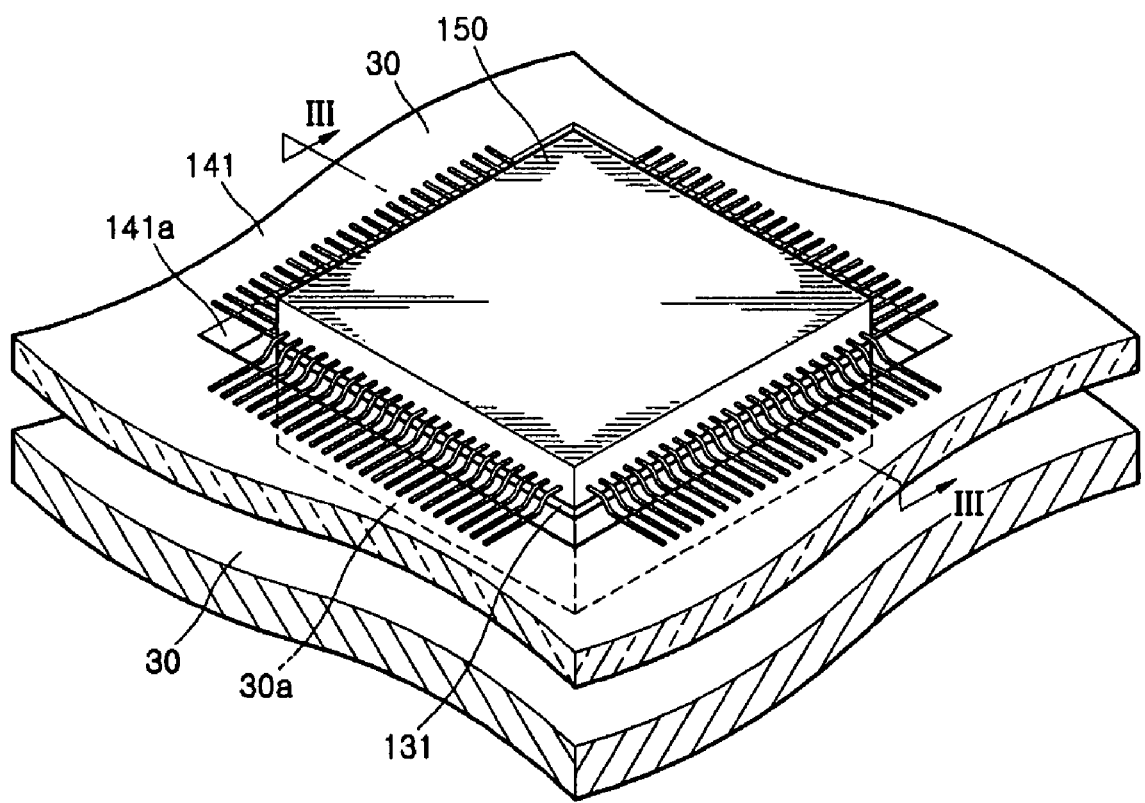
FIG. 2 is an exploded perspective view of an IPM device installed on a convex unit of a chassis of FIG. 1, and a heat radiation sheet.
Figure 3:
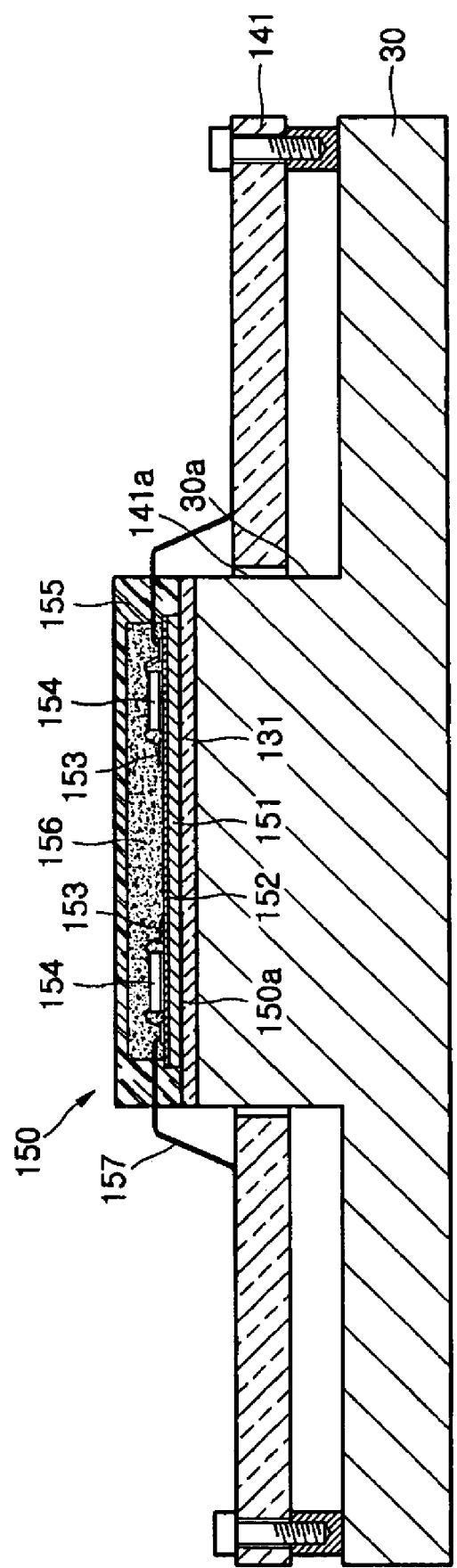
FIG. 3 is a cross-sectional view taken along line III-III of FIG. 2.

FIG. 1 is an exploded perspective view of a plasma display module according to an embodiment of the present invention, FIG. 2 is an exploded perspective view of an IPM device installed on a convex unit of a chassis of FIG. 1, and a heat radiation sheet, and FIG. 3 is a cross-sectional view taken along line III-III of FIG. 2.

Referring to FIGS. 1 through 3, a plasma display module 10 includes a plasma display panel 100 on which images are displayed.

The plasma display panel 100 can be one of various types. As an example, the plasma display panel 100 can be a three-electrode, alternating current, surface-discharge type plasma display panel. In this case, the plasma display panel 100 includes a first panel 110 and a second panel 120. In one embodiment, the first panel 110, although not shown in FIG. 1, includes a plurality of sustain electrode pairs including stripe shaped X and Y electrodes, a first dielectric layer covering the sustain electrode pairs, and a protection layer coated on the surface of the first dielectric layer.

The second panel 120 faces the first panel 110. In one embodiment, although not shown in the drawing, the second panel 120 includes a plurality of address electrodes crossing the sustain electrode pairs, a second dielectric layer covering the address electrodes, barrier ribs formed on the second dielectric layer to define discharge cells in which discharge occurs and to prevent crosstalk, and red, green, and blue phosphor layers coated in the discharge cells defined by the barrier ribs.

Here, the discharge cells, respectively, correspond to the regions where the sustain electrode pairs cross the address electrodes, and are filled with a discharge gas.

In one embodiment, a chassis 30 is located on one side of the plasma display panel 100, and at least includes a convex unit 30a for heat dissipation on the opposite side of the plasma display panel 100. In one embodiment, the convex unit 30a of the chassis 30 can be integrally formed with the chassis 30 by, for example, a deep drawing method. In another embodiment, the convex unit 30a, after the chassis 30 and the convex unit 30a are separately manufactured, can be coupled to the chassis 30 by way of coupling elements such as bolts.

The chassis 30 prevents the plasma display panel 100 from becoming too hot by dissipating heat from the plasma display panel 100, and from being deformed due to heat or damaged by external impact.

One surface of the chassis 30 can be coupled to the plasma display panel 100 by an adhesion member 135 such as double-sided tape.

The chassis 30 generally has sufficient strength to support and prevents the plasma display panel 100 from being deformed or damaged. To reinforce the chassis 30, the plasma display module 10 can include a reinforcing member 90 located on the opposing surface of the chassis 30 as shown in FIG. 1.

In one embodiment, the plasma display module 10 can include a heat radiation sheet 130 located between the chassis 30 and the plasma display panel 100 and contacting the surface of the plasma display panel 100 facing the chassis 30, to prevent the plasma display panel 100 from accumulating heat when the plasma display panel 100 is driven. In one embodiment, the heat radiation sheet 130 is formed of an aluminum sheet, a copper sheet, or a thermal conductive resin.

A driving circuit unit 140 is located on the opposing surface of the chassis 30 as shown in FIG. 1, to drive the plasma display panel 100. For this purpose, the driving circuit unit 140 includes various electronic parts (not shown) to apply electrical signals for displaying images and to supply power to the plasma display panel 100. In one embodiment, the driving circuit unit 140 is electrically connected to the plasma display panel 100 through signal transmitting elements 31 and 32 to transmit signals to the plasma display panel 100. The signal transmitting elements 31 and 32 can be flexible printed cable (FPC), tape carrier package (TCP), or chip on film (COF).

The electronic parts included in the driving circuit unit 140, as depicted in FIGS. 2 and 3, may include an intelligent power module (IPM) device 150. The IPM device 150 can have various structures, such as a combination of more than two different kinds of integrated circuit or a combination of one kind of integrated circuit and an independent circuit device. As an example, as depicted in FIG. 3, the IPM device 150 includes a metal substrate 151 formed of aluminum, an insulating layer 152 formed on the surface of the metal substrate 151, a patterned conductive layer 153 formed on the insulating layer 152, and a plurality of devices 154 connected to the conductive layer 153. In one embodiment, the metal substrate 151, the insulating layer 152, the conductive layer 153, and the devices 154 are accommodated in a cover unit 155 formed of, for example, a resin. The cover unit 155 covers the surface of the metal substrate 151 on which the insulating layer 152 is formed. In this embodiment, an inner space of the cover unit 155 is filled with an insulating filler 156, and a lead 157 connected to the conductive layer 153 in the cover unit 155 is extending to the outside to be connected to the driving circuit unit 140.

Figure 4:
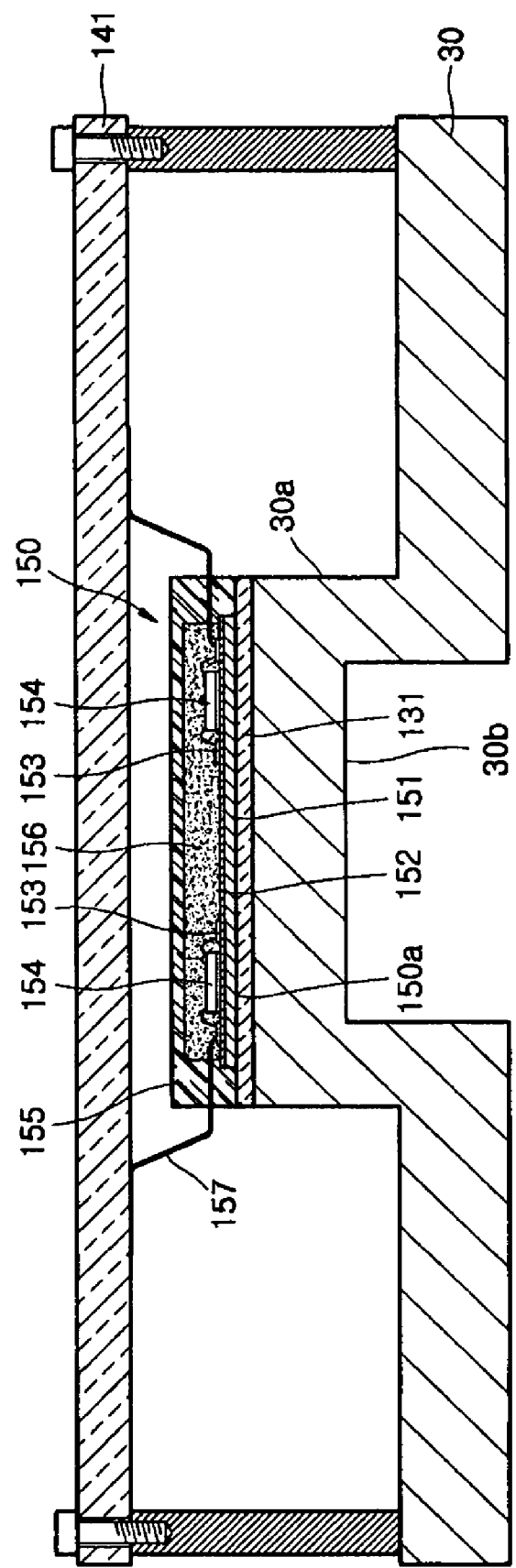
FIG. 4 is a cross-sectional view of a modified version of the chassis of FIG. 3.
Figure 5:
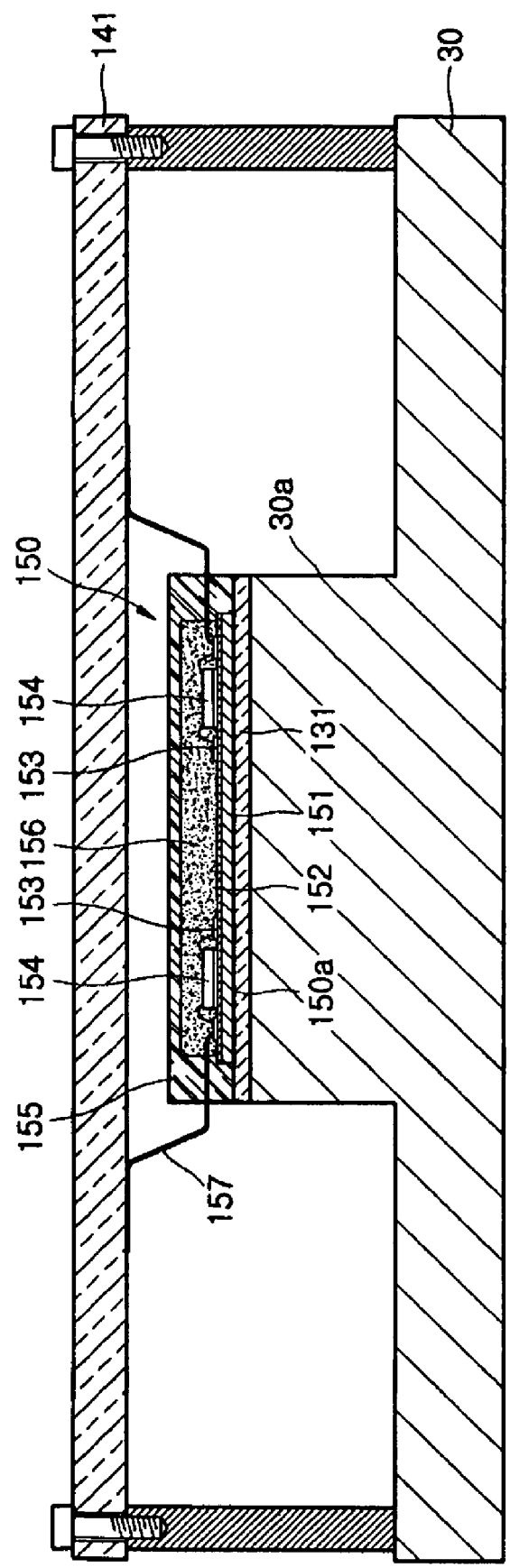
FIG. 5 is a cross-sectional view (corresponding to the cross-sectional view of FIG. 3) of a plasma display module according to another embodiment of the present invention.

Since the IPM device 150 includes a plurality of devices 154, a significant amount of heat is generated when the plasma display module 10 is in operation. As discussed above, to dissipate the heat through heat exchange with ambient air, the convex unit 30a of the chassis 30 is located on one surface of the IPM device 150 facing the outer surface of the metal substrate 151 as shown in FIGS. 3-5. Therefore, the installation of a heat radiation member such as a heat sink, as in a conventional plasma display module, is unnecessary.

In one embodiment, the heat generation unit 150a of the IPM device 150 is located on the surface of the convex unit 30a of the chassis 30.

The driving circuit unit 140 includes at least one driving circuit substrate 141. The driving circuit substrate 141 includes various electronic parts except for integrated circuits that generate a great deal of heat, such as the IPM device 150. The integrated circuits that generate much heat, such as the IPM device 150, are located on the convex unit 30a of the chassis 30, and are electrically connected to the driving circuit substrate 141 by connection elements such as leads 157.

In one embodiment, the convex unit 30a may be located higher than the driving circuit substrate 141 as shown in FIG. 3. In this embodiment, the integrated circuits such as the IPM device 150 can be easily mounted on the convex unit 30a of the chassis 30, thereby simplifying the overall configuration of the driving circuit unit 140.

In this embodiment, at least one hole 141a may be formed in the driving circuit substrate 141 so that the convex unit 30a of the chassis 30 can protrude through. In one embodiment, the number of holes 141a formed in the driving circuit substrate 141 are equal to the number of integrated circuits which are mounted on the convex units 30a and protrude from the driving circuit substrate 141 via the at least one hole 141a.

In one embodiment, the convex unit 30a is located to face the outer surface of the metal substrate 151 of the mounted integrated circuits as shown in FIGS. 3-5. In one embodiment, the convex unit 30a may be sized to correspond to the outer surface of the metal substrate 151.

In another embodiment, a heat radiation sheet 131 may further be located between the convex unit 30a of the chassis 30 and the integrated circuits.

In this embodiment, the heat radiation sheet 131 prevents the integrated circuits from being damaged by mechanical pressure when they directly contact the convex unit 30a of the chassis 30. The heat radiation sheet 131 effectively dissipates heat generated by the integrated circuits through the convex unit 30a of the chassis 30. In one embodiment, the heat radiation sheet 131 may be formed of a material that includes an elastic polymer having high flexibility and thermal conductivity.

Also, the integrated circuits such as the IPM device 150 generate a great deal of vibration and noise when the plasma display module is driven. However, as described above, since the heat radiation sheet 131 is formed of a highly flexible and conductive material such as an elastic polymer, the heat radiation sheet 131 absorbs the vibration and noise.

FIG. 4 is a cross-sectional view of a modified version of the chassis of FIG. 3. Except for the shape of the chassis, elements have the same configuration as in FIG. 3, and thus, like reference numerals refer to like elements.

In one embodiment, as shown in FIG. 4, a concave unit 30b is further formed on the rear surface of the chassis 30 aligned with the convex unit 30a formed on the upper surface of the chassis 30. Accordingly, the chassis 30 of FIG. 4 differs from the chassis 30 of FIG. 3 in that the convex unit 30a does not protrude from the driving circuit substrate 141 and the concave unit 30b is further provided on the opposite side of the chassis 30. However, in the FIG. 3 embodiment, the chassis 30 may further include a concave unit on the opposite side of the chassis 30 (not shown). The concave unit 30b allows the material for forming the chassis 30 to be saved by as much as the volume of the concave unit 30b. In the FIG. 4 embodiment, since the convex unit 30a does not protrude from the driving circuit substrate 141, there is no need to form the hole 141a in the driving circuit substrate 141 as in FIG. 3.

FIG. 5 is a cross-sectional view (corresponding to the cross-sectional view of FIG. 3) of a plasma display module according to another embodiment of the present invention. Like reference numerals refer to like elements in FIGS. 3 and 4.

The difference between the embodiments of FIGS. 5 and FIG. 3 is that unlike the convex unit 30a of the chassis 30 of FIG. 3, the convex unit 30a of the chassis 30 in FIG. 5 is located at a lower elevation than the driving circuit substrate 141.

In the FIG. 5 embodiment, as in the FIG. 4 embodiment, the convex unit 30a does not protrude upward through the driving circuit unit 140, but is lower than the driving circuit substrate 141. Therefore, there is no need to form the hole 141a in the driving circuit substrate 141 as in FIG. 3.

The main path of heat dissipated to the outside from heat generation units of the integrated circuits in the plasma display module 10 according to embodiments of the present invention will now be described.

As depicted in FIGS. 3 through 5, a great deal of heat is generated by the integrated circuits such as the IPM device 150 when the plasma display module 10 is driven. The heat is transmitted to the convex unit 30a of the chassis 30 through the heat radiation sheet 131, and dissipated into the air through the plane surface of the chassis 30.

In one embodiment, the plasma display module can effectively dissipate heat generated by the integrated circuits through a chassis, by improving the heat radiation structure of the integrated circuits that generate a significant amount of heat. Accordingly, the degradation of the integrated circuits can be prevented, thereby securing the reliability of the driving circuit unit.

In another embodiment, the plasma display module can reduce the vibration and noise generated by the integrated circuits, since a heat radiation sheet formed of a material having high flexibility and thermal conductivity is located between the integrated circuits and the chassis, and can readily ground leads of the devices.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A plasma display module, comprising:
a plasma display panel that displays images by way of gas discharge;
a chassis having first and second surfaces opposing each other, wherein the first surface of the chassis is coupled to the plasma display panel; and
a driving circuit unit which is located on the second surface of the chassis to generate electrical signals configured to drive the plasma display panel, and includes at least one integrated circuit,
wherein the chassis further includes at least one convex unit, and the at least one integrated circuit is located on one of each of the at least one convex unit of the chassis,
wherein the at least one convex unit is part of the chassis and extends from the chassis,
wherein each of the at least one convex unit comprises a top surface and two side surfaces extending from the chassis and connected to the top surface, and
wherein the heights of the two side surfaces between the chassis and the top surface are substantially the same as each other.

2. The plasma display module of claim 1, further comprising a heat radiation sheet interposed between the convex unit of the chassis and the at least one integrated circuit.

3. The plasma display module of claim 2, wherein the heat radiation sheet is formed of a material containing an elastic polymer having high flexibility and thermal conductivity.

4. The plasma display module of claim 1, wherein the at least one integrated circuit is an intelligent power module (IPM) which is formed of i) more than two different integrated circuits or ii) one kind of integrated circuit and an independent circuit device.

5. The plasma display module of claim 1, wherein the at least one integrated circuit has a heat generation unit located on the surface of the at least one convex unit.

6. The plasma display module of claim 1, wherein the driving circuit unit comprises at least one driving circuit substrate, and wherein the driving circuit substrate is connected to the chassis via at least one connection member so that there is a gap formed between the chassis and the driving circuit substrate.

7. The plasma display module of claim 6, wherein the at least one convex unit is located farther than the driving circuit substrate from the plasma display panel, and wherein the height of the convex unit is greater than the gap.

8. The plasma display module of claim 6, wherein the at least one convex unit is located closer to the plasma display panel than the driving circuit substrate is to the plasma display panel, and wherein the convex unit is located within the gap.

9. A plasma display module, comprising:
a plasma display panel that displays images by way of gas discharge;
a chassis having first and second surfaces opposing each other, wherein the first surface of the chassis is coupled to the plasma display panel; and
a driving circuit unit which is located on the second surface of the chassis to generate electrical signals configured to drive the plasma display panel, and includes at least one integrated circuit,
wherein the chassis further includes at least one convex unit, and the at least one integrated circuit is located on the convex unit of the chassis,
wherein the driving circuit unit comprises at least one driving circuit substrate,
wherein the at least one convex unit is located farther than the driving circuit substrate from the plasma display panel, and
wherein at least one hole is defined in the driving circuit substrate, and wherein the at least one convex unit protrudes from the driving circuit substrate via the at least one hole.

10. A plasma display module, comprising:
a chassis configured to support a plasma display panel, wherein the chassis includes at least one protruding portion; and
a plurality of integrated circuits configured to drive the plasma display panel,
wherein at least one of the plurality of integrated circuits is located on one of each of the at least one protruding portion of the chassis,
wherein the at least one protruding portion is part of the chassis and extends from the chassis,
wherein each of the at least one protruding portion comprises a top surface and two side surfaces extending from the chassis and connected to the top surface, and
wherein the heights of the two side surfaces between the chassis and the top surface are substantially the same as each other.

11. The plasma display module of claim 10, further comprising a heat radiation sheet formed between the at least one protruding portion and the at least one integrated circuit.

12. The plasma display module of claim 10, further comprising a driving circuit substrate connected to the chassis, wherein the driving circuit substrate is connected to the chassis via at least one connection member so that there is a gap formed between the chassis and the driving circuit substrate.

13. A plasma display module, comprising:
a chassis configured to support a plasma display panel, wherein the chassis includes at least one protruding portion; and
a plurality of integrated circuits configured to drive the plasma display panel,
a driving circuit substrate connected to the chassis,
wherein at least one of the plurality of integrated circuits is located on the at least one protruding portion of the chassis, and
wherein at least one hole is defined in the driving circuit substrate, and wherein the at least one integrated circuit protrudes from the driving circuit substrate via the at least one hole.

14. The plasma display module of claim 12, wherein the protruding portion is located closer to the plasma display panel than the driving circuit substrate is to the plasma display panel, and wherein the protruding portion is located within the gap.

15. The plasma display module of claim 10, wherein the chassis further includes at least one recessed portion formed on the opposite side of the chassis with respect to the at least one protruding portion.

16. The plasma display module of claim 15, wherein the at least one recessed portion is aligned with the at least one protruding portion in a direction perpendicular to a selected surface of the chassis.

17. The plasma display module of claim 10, wherein the plasma display module is configured to dissipate heat generated from the plurality of integrated circuits without the use of a heat sink.

18. The plasma display module of claim 10, wherein the at least one protruding portion is integrally formed with the chassis.

19. A method of using a plasma display module, comprising:
providing a chassis configured to support a plasma display panel, wherein the chassis includes at least one protruding portion; and
driving the plasma display panel by way of a plurality of integrated circuits,
wherein at least one of the plurality of integrated circuits is located on one of each of the at least one protruding portion of the chassis,
wherein the at least one protruding portion is part of the chassis and extends from the chassis,
wherein each of the at least one protruding portion comprises a top surface and two side surfaces extending from the chassis and connected to the top surface, and
wherein the heights of the two side surfaces between the chassis and the top surface are substantially the same as each other.

20. The method of claim 19, further comprising dissipating heat generated from the at least one integrated circuit through the at least one protruding portion of the chassis.

* * * * *